(12) United States Patent
Tymashov et al.

(10) Patent No.: US 8,159,118 B2
(45) Date of Patent: Apr. 17, 2012

(54) ELECTRON GUN

(75) Inventors: Viktor A. Tymashov, Kyiv (UA); Oleg L. Zhdanov, Kyiv (UA); Sergiy I. Ryabenko, Kyiv (UA); Andriy A. Tsepkalov, Kyiv (UA); Steven M. Burns, Aliso Viejo, CA (US)

(73) Assignee: United Technologies Corporation, Hartford, CT (US)

( * ) Notice: Subject to any disclaimer, the term of this patent is extended or adjusted under 35 U.S.C. 154(b) by 1289 days.

(21) Appl. No.: 11/266,032

(22) Filed: Nov. 2, 2005

(65) Prior Publication Data

US 2007/0096620 A1 May 3, 2007

(51) Int. Cl.
*H01J 37/00* (2006.01)
*H05H 1/00* (2006.01)

(52) U.S. Cl. ..... 313/230; 313/237; 313/310; 313/361.1; 313/359.1

(58) Field of Classification Search ............... 313/310, 313/341, 337, 237, 238, 230, 359.1, 361.1; 373/13
See application file for complete search history.

(56) References Cited

U.S. PATENT DOCUMENTS

| | | |
|---|---|---|
| 3,187,216 A | 6/1965 | Sciaky |
| 4,057,746 A | 11/1977 | Dumonte |
| 4,084,077 A | 4/1978 | Porazhinsky et al. |
| 4,665,297 A | 5/1987 | Schiller et al. |
| 4,803,398 A | 2/1989 | Kraft et al. |
| 5,661,369 A | 8/1997 | Sanderson |
| 6,548,946 B1 | 4/2003 | Zengel |
| 6,781,296 B2 * | 8/2004 | Mensinger ............... 313/346 R |
| 2004/0090167 A1 | 5/2004 | Movchan et al. |

FOREIGN PATENT DOCUMENTS

| | | |
|---|---|---|
| EP | 0211403 A1 | 2/1987 |
| GB | 1030708 | 5/1966 |
| JP | 55151738 A | 11/1980 |
| JP | 11016485 A | 1/1999 |
| JP | 11111205 A | 4/1999 |
| JP | 2001312986 A | 11/2001 |
| JP | 2004259478 A | 9/2004 |
| JP | 2005026026 A | 1/2005 |
| JP | 2005038857 A | 2/2005 |
| WO | 99/16101 A2 | 4/1999 |
| WO | 01/15192 A1 | 3/2001 |

OTHER PUBLICATIONS

European Search Report for EP Patent Application No. 062556469, dated Jan. 13, 2010.
English translation of Japanese Office Action for 2006-285627, dated Jun. 30, 2009.
Ukrainian Office Action for Patent Application No. 200611520, dated Dec. 11, 2009.

* cited by examiner

*Primary Examiner* — Nimeshkumar Patel
*Assistant Examiner* — Anthony Perry
(74) *Attorney, Agent, or Firm* — Bachman & LaPointe, P.C.

(57) ABSTRACT

An electron gun includes the following: a primary thermionic electron source, a secondary thermionic electron source and a focusing electrode disposed within a first housing that includes one or more reference members adjustably attached to a housing support connected to a first platform; an anode and one or more focusing coils disposed within a second housing comprising one or more insulating members adjustably connected to the first platform; and one or more deflection coils disposed within a third housing connected to the second housing and located opposite said first housing.

28 Claims, 3 Drawing Sheets

ELECTRON GUN

FIELD OF USE

This invention relates to an electron gun and, more particularly, to an electron gun having two thermionic electron sources.

BACKGROUND OF THE INVENTION

Electron beam furnaces and coaters are used to heat materials to produce vapors for deposition on an article. An electron beam furnace includes an electron gun, a deflection system, and a cooling system. The electron gun generates an electron beam. The deflection system directs the electron beam toward the material to be heated. The cooling system cools the electron gun to prevent it from overheating.

An electron gun typically includes an electron source, a focusing electrode, and an accelerating electrode. The electron source is typically a cathode heated by an electric current to cause the cathode to emit electrons. The focusing electrode is typically negatively charged to repel the electrons and thereby direct the electrons in a direction generally toward the accelerating electrode. The accelerating electrode is typically less negatively charged than the electron source and the focusing electrode to cause the electrons to form into a beam and travel in the downstream direction.

In one known type of electron gun, the electron source and the focusing electrode are elongated and disposed in a head. The head is supported by a platform spaced apart from the accelerating electrode. This type of electron gun is reliable and available in many different power ratings. The physical size of the head, the accelerating electrode, and the platform of a given one of these electron guns depends on its power rating.

During operation the electron beam generates ions, the ions move in the reverse direction relative to the motion of the electrons and accelerate in the electric field between the cathode and anode. As these high energy ions strike the cathode surface, the ions cause the cathode material to diffuse and vaporize. The cathode eventually deforms due to constant reflected electron bombardment and erodes away. Cathode deformation also impacts the performance of the electron gun. The evaporation rate of the electron gun becomes altered. As a result, the average life and overall useful life of the electron gun becomes significantly reduced. In turn, one's ability to coat a requisite number of targets in assembly is hampered and overall productivity is significantly affected.

Consequently, there exists a need for an electron gun assembly constructed to increase service and active life of the electron gun as well as permit the quick and efficient replacement of the thermion source without restricting the power rating of the electron gun.

SUMMARY OF THE INVENTION

In accordance with the present invention, an electron gun broadly comprises a primary thermionic electron source, a secondary thermionic electron source and a focusing electrode disposed within a first housing broadly comprising one or more reference members adjustably attached to a housing support connected to a first platform; an anode and one or more focusing coils disposed within a second housing broadly comprising one or more insulating members adjustably connected to the first platform; and one or more deflection coils disposed within a third housing connected to the second housing and located opposite the first housing.

In accordance with the present invention, a method for using an electron gun broadly comprises heating a primary thermionic electron source; emitting a first electron beam from the primary thermionic electron source through a first electric field; striking a secondary thermionic electron source with the first electron beam; heating the secondary thermionic electron source; emitting a second electron beam from the secondary thermionic electron source; accelerating the second electron beam through a second electric field; focusing the second electron beam through a focusing electrode; passing the second electron beam through an accelerating anode; focusing the second electron beam through one or more magnetic fields; deflecting the second electron beam through one or more magnetic fields; and striking a target with the second electron beam.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
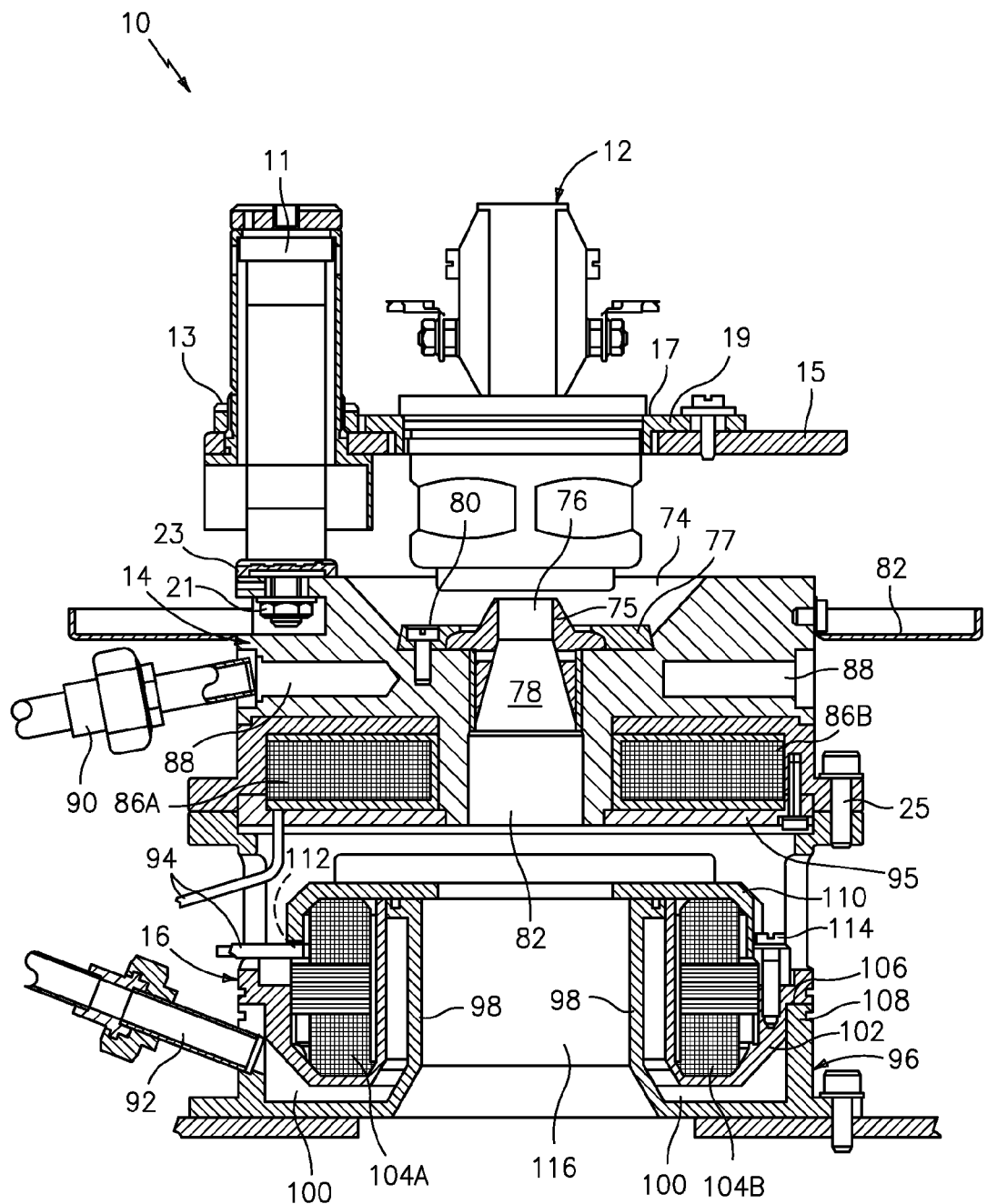
FIG. 1 is a representation of a cross-sectional view of the second housing and third housing of an axial electron gun of the present invention.

The axial electron gun of the present invention incorporates two thermionic electron sources. Upon heating a primary thermionic electron source, the primary thermionic electron source emits a flow of electrons which bombards a secondary thermionic electron source causing its heating. The electrons within the beam accelerate and obtain energy within electric fields of opposing potentials generated by the primary and secondary thermionic electron sources. The acceleration of electrons within the electric field causes the electrons to align and form an electron beam with the aid of the focusing electrode. The focusing electrode directs the electron beam into an aperture of an accelerating anode aligned in a direct line-of-sight with the secondary thermionic electron source. The electron beam continues accelerating as it passes the anode and enters within range of magnetic fields generated by a set of focusing coils and a set of deflection coils. The two sets of coils are capable of generating magnetic fields having sufficient intensity to deflect the electron beam vertically and horizontally and further focus the electron beam. Depending on a direction and intensity of this field, the electron beam deflects in the required direction. The resultant electron beam may be utilized to heat objects and even perform scanning operations.

The electron gun of the present invention is an axial electron gun capable of mounting to existing electron beam physical vapor deposition equipment due to its compact size and versatile nature. The axial electron gun 10 generally comprises a first housing 12, or a thermionic electron source assembly, a second housing 14, or an electron beam focusing assembly, and a third housing 16, or an electron beam control module. Components of the electron beam control module may also be found within the electron beam focusing assembly.

The present axial electron gun employs one or more means for adjusting. The means for adjusting may generally be described as any type of adjustable implement that can secure two or more parts together and then release, if necessary, to disassemble the parts. Suitable adjustable implements may include, but are not limited to, screws, bolts, nuts, clamps, and the like. Likewise, the channels through which these means for adjusting are inserted may be possess the necessary complimentary facial indicia to mate, if necessary, with the means for adjusting. Representative facial indicia may include, but is not limited to, grooves, smooth bore, chamfered surfaces, tapered surfaces, combinations comprising at least one of the foregoing facial indicia, and the like. The present axial electron gun also employs one or more means for securing. The means for securing may generally be described as any type of securable implement that can secure two or more parts together and then release, if necessary, to disassemble the parts. Suitable securable implements may include, but are not limited to, screws, bolts, nuts, clamps, and the like.

Figure 2:
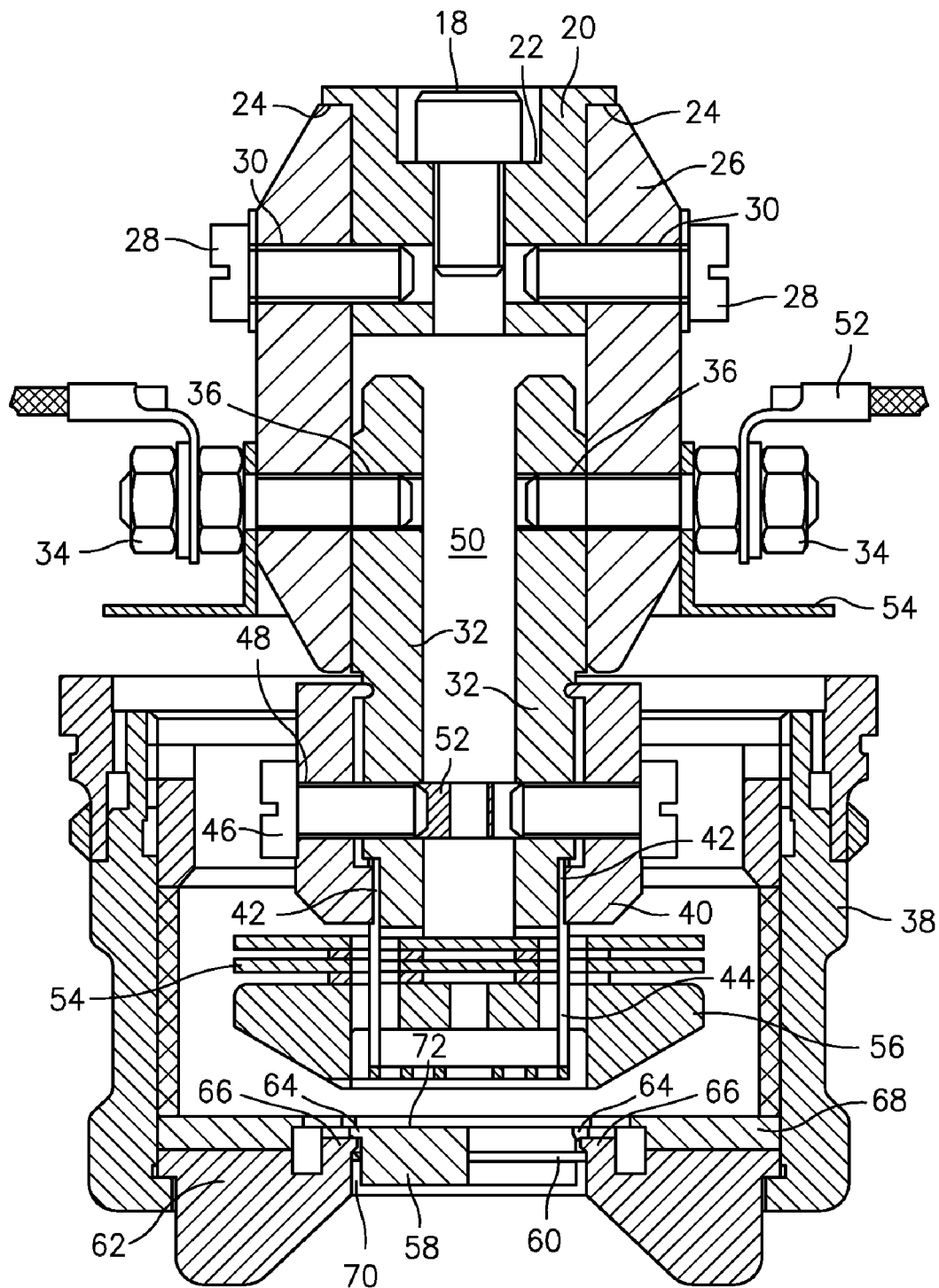
FIG. 2 is a representation of a cross-sectional view of the first housing of the axial electron gun of FIG. 1.

Referring now to FIGS. 1 and 2, the thermionic electron source assembly of first housing 12 may be connected to second housing 14 by one or more high voltage insulators 11. High voltage insulators 11 may be disposed through one or more apertures 13 of a plate 15 of first housing 12. Apertures 13 are designed to threadingly receive high voltage insulators 11. Plate 15 also includes an aperture 17 and an adjustment flange 19 through which the thermionic electron source assembly is disposed there through and adjustably positioned. High voltage insulators 11 may be secured to second housing 14 using a means for securing 21 attached to a ledge 23 of second housing 14. Second housing 14 may be detachably connected to third housing 16 using one or more second means for securing 25. For purposes of illustration, high voltage insulators 11 may be enclosed within a separate housing, for example, a cylindrical housing with a cap affixed on top in order to prevent exposure to dusting from the metal vapor deposition process.

First housing 12 (FIG. 2) of axial electron gun 10 may comprise a false trap 18 disposed within a false trap holder 20. For purposes of illustration, false trap holder 20 may include a ledge 22 or other means for supporting false trap 18. False trap holder 20 may further include a lip 24 designed to be supported by an insulator 26. Insulator 26 may comprise a single solid part or two halves that attach together. Insulator 26 connects to form an aperture designed to receive false trap holder 20. A first means for adjusting 28 (shown as screws) may be disposed within one or more first channels 30 formed within insulator 26 and false trap holder 20 and hold false trap holder 20 firmly in place within insulator 26. Insulator 26 may be further disposed about a filament holder 32. Filament holder 32 may be a single solid part or comprise two halves that combine together. Filament holder 32 may be secured firmly in place within insulators 26 by a second means for adjusting 34 (shown as double nutted threaded studs) disposed within one or more second channels 36 formed within insulator 26 and filament holder 32. One or more electrical terminals 52 are preferably connected to second means for adjusting 34, and one or more shielding apparatus 54 may be disposed between electrical terminals 52 and second means for adjusting 34. Shielding apparatus 54 are designed to protect insulator 26 of axial electron gun 10 against dusting created by the metal vapor deposition process. The false trap holder 20, insulator 26 and filament holder 32 combine to form and define a gun chamber 50 within first housing 12.

At least a portion of filament holder 32 is inserted within a thermal barrier enclosure 38 of first housing 12. Within thermal barrier enclosure 38, a clamp 40 may be disposed about filament holder 32. Clamp 40 may be a single solid part or comprise two halves that combine together. Clamp 40 and filament holder 32 may combine to form a cavity 42 designed to receive a primary thermionic electron source 44. Filament holder 32 may also be secured firmly in placed within clamp 40 by a third means for adjusting 46 (shown as screws) disposed within one or more third channels 48 formed within filament holder 32 and clamp 40.

Primary thermionic electron source 44 may be disposed within cavity 42 and through a first thermal shield 54 and a second thermal shield 56. Preferably, primary thermionic electron source 44 is a filament coil circumferentially disposed between filament holder 32 and clamp 40. Suitable filament coils may comprise any suitable material for use in an electron gun that is capable of emitting electrons when heated such as, but not limited to, tungsten and the like. First thermal shield 54 may comprise a plurality of thermal shield plates having apertures designed to permit insertion of primary thermionic electron source 44 therethrough. Likewise, second thermal shield 56 may also comprise an aperture designed to permit insertion of primary thermionic electron source 44 therethrough. Second thermal shield 56 is preferably disposed in contact with and below first thermal shield 54. Primary thermionic electron source 44 is preferably disposed opposite a secondary thermionic electron source 58.

Secondary thermionic electron source 58 may be disposed within one or more adjustable rings 60 and further disposed within a focusing electrode 62 secured to thermal barrier enclosure 38. Adjustable rings 60 are preferably designed to accommodate and secure secondary thermionic electron source 58 within focusing electrode 62. Secondary thermionic electron source 58 may also be supported by a ledge 66 of focusing electrode 62. Focusing electrode preferably includes an aperture 70 through which secondary thermionic electron source 58 is disposed through and a planar surface 72 of source 58 is in a direct line of sight to secondary housing 14. Secondary thermionic electron source 58 may comprise a substantially cylindrical shape having a circumferentially disposed lip 64 about a planar surface of source 58. Circumferentially disposed lip 64 is preferably in contact with ledge 66 such that secondary thermionic electron source 58 may be suspended within aperture 70 of focusing electrode 62. A plate 68 may be disposed in contact with and on top of both secondary thermionic electron source 58 and focusing electrode 62 to firmly secure both components within thermal barrier enclosure 38.

Secondary thermionic electron source 58 may comprise any suitable material for use in an electron gun that is capable of emitting electrons when heated such as, but not limited to, tungsten and the like. Preferably, primary thermionic electron source 44 and secondary thermionic electron source 58 comprise the same material.

The electron beam focusing assembly of second housing 14 includes a depressed area 74 where an accelerating anode 78 having a substantially frustoconical shape comprising an aperture 76 may be disposed therein. Frustoconical projection 75 may be secured in place by a plate 77 and a fifth means for adjusting 80 (shown as screws) disposed thereupon within depressed area 74. Aperture 76 is preferably aligned in a direct line-of-sight with secondary thermionic electron source 58. An accelerating anode 78 is preferably positioned and aligned in a direct line-of-sight with secondary thermionic electron source 58. A pair of focusing coils 86A, 86B may be disposed within second housing 14 such that each focusing coil 86A and 86B are aligned parallel to electron beam chamber 82 and receive power via a power connection 94. Surrounding each focusing coil 86A, 86B are a plurality of cooling channels 88 designed to carry a cooling fluid flow and prevent coils 86A and 86B from overheating during use of axial electron gun 10. A cooling fluid reservoir (not shown) may be connected to axial electron gun 10 using one or more cooling fluid hoses 90 and 92 to deliver cooling fluid to the axial electron gun 10. Focusing coils 86A, 86B and cooling channels 88 are preferably protected from electron scattering and contamination by a thermal shielding material 95.

The electron beam control module of third housing 16 may be disposed in contact with and below second housing 14. Third housing 16 may comprise a base 96 and a pair of sidewalls 98 integrally disposed to base 96. Sidewalls 98 extend to form both a cooling channel 100 and a cradle structure 102 designed to accommodate a pair of deflection coils 104A, 104B attached to power connection 94. Cradle structure 102 includes an edge 106 integrally formed therein and designed to be supported by an exterior wall 108 of base 96. A thermal shield 110 having an aperture 112 may be disposed upon deflection coils 104A, 104B, cradle structure 102 and sidewalls 98. Thermal shield 110 may be connected to cradle structure 102 by a sixth means for adjusting 114 in order to protect deflection coils 104A, 104B from scattered electrons and contamination. Thermal shield 110 and sidewalls 98 combine to form and define an electron beam chamber 116 of axial electron gun 10. Electron beam chamber 116 is preferably aligned with in a direct line-of-sight with electron beam chamber 82 of second housing 14. Third housing 16 of axial electron gun 10 may be secured to an existing structure using any number of means for securing as discussed earlier and known to one of ordinary skill in the art.

Focusing coils 86A, 86B and deflection coils 104A, 104B may comprise magnets and, preferably, ring-type 12-pole magnetic circuits combined with the coils. The magnetic circuits, coils and housing 12, 14 and 16 are all under "ground" potential. Focusing coils 86A, 86B and deflection coils 104A, 104B are each wound together, respectively, in groups of two and connected in series such that the beginning of one wound coil 86A, for example, the north pole, is connected to the end of another wound coil 86B, for example, the south pole. Either focusing coils, 86A and 86B or deflection coils 104A and 104B, generate magnetic fields capable of vertically deflecting an electron beam while the other set of coils, 104A and 104B or 86A and 86B, generates magnetic fields capable of horizontally deflecting the electron beam.

High potential circuits may be utilized for filament current circuits, bombardment circuits and accelerating voltage circuits for axial electron gun 10. Low potential circuits may be utilized as power supply circuits for both deflection coils and magnets and focusing coil and magnets. The operating power of axial electron may be expressed by multiplication of a beam current by accelerating voltage. The power of axial electron gun 10 may be adjusted through the change of filament current of the primary thermionic electron source 44 for the change of bombardment current of the secondary thermionic electron source 58, that is, through the change of temperature of source 58.

During operation, a filament current of about 1 ampere (A) to 80 A, and more particularly about 5 A to 70 A, and preferably about 10 A to 60 A may be applied through electrical terminals 52 through insulators 26 and to the filament coil of primary thermionic electron source 44. Primary thermionic electron source 44 generates a thermionic particle cloud, for example, an electron cloud, whose electrons align within the electric field generated by the current application through the primary thermionic electron source 44. These electrons are directed toward, bombard and heat secondary thermionic electron source 58 to generate another thermion particle cloud. The bombardment voltage may be approximately 0.5 kilovolts (kV) to 2.5 kV, and more particularly about 1.0 kV to 2.0, and preferably 1.5 kV. The bombardment current may be adjusted, if necessary, up to about 1 A. Secondary thermionic electron source 58 is also charged by the current to possess an opposite potential, for example, negative potential, relative to both primary thermionic electron sources 44 to create another electric field of opposite potential. The accelerating voltage of the electric field may be about 5 kV to 45 kV, and more particularly about 10 kV to 35 kV, and preferably about 17 kV to 25 kV. As the electron beam passes through the electric fields of opposite potential the electrons accelerate. The thermions, or electrons, are aligned within the electric field and directed by focusing electrode 62 towards accelerating anode 78 as an electron beam (not shown).

As the electron beam passes through accelerating anode 78, the electrons enter magnetic fields generated by focusing coils 86A, 86B and deflection coils 104A, 104B. A total current of about 0.1 A to 2 A, and more particularly about 0.5 A to 1.5 A, and preferably 1 A may be applied to focusing coils 86A, 86B. A total current of about 1 A to 5 A, and more particularly about 2 A to 4 A, and preferably about 3 A may be applied to deflection coils 104A, 104B. The application of varying currents generates magnetic fields that permit the operator of the axial electron gun 10 to deflect the electron beam at an angle of about 5 degrees (°) to 35°, and more particularly about 10° to 30°, and preferably about 20° in order to perform scanning operations using the electron beam.

Figure 3:
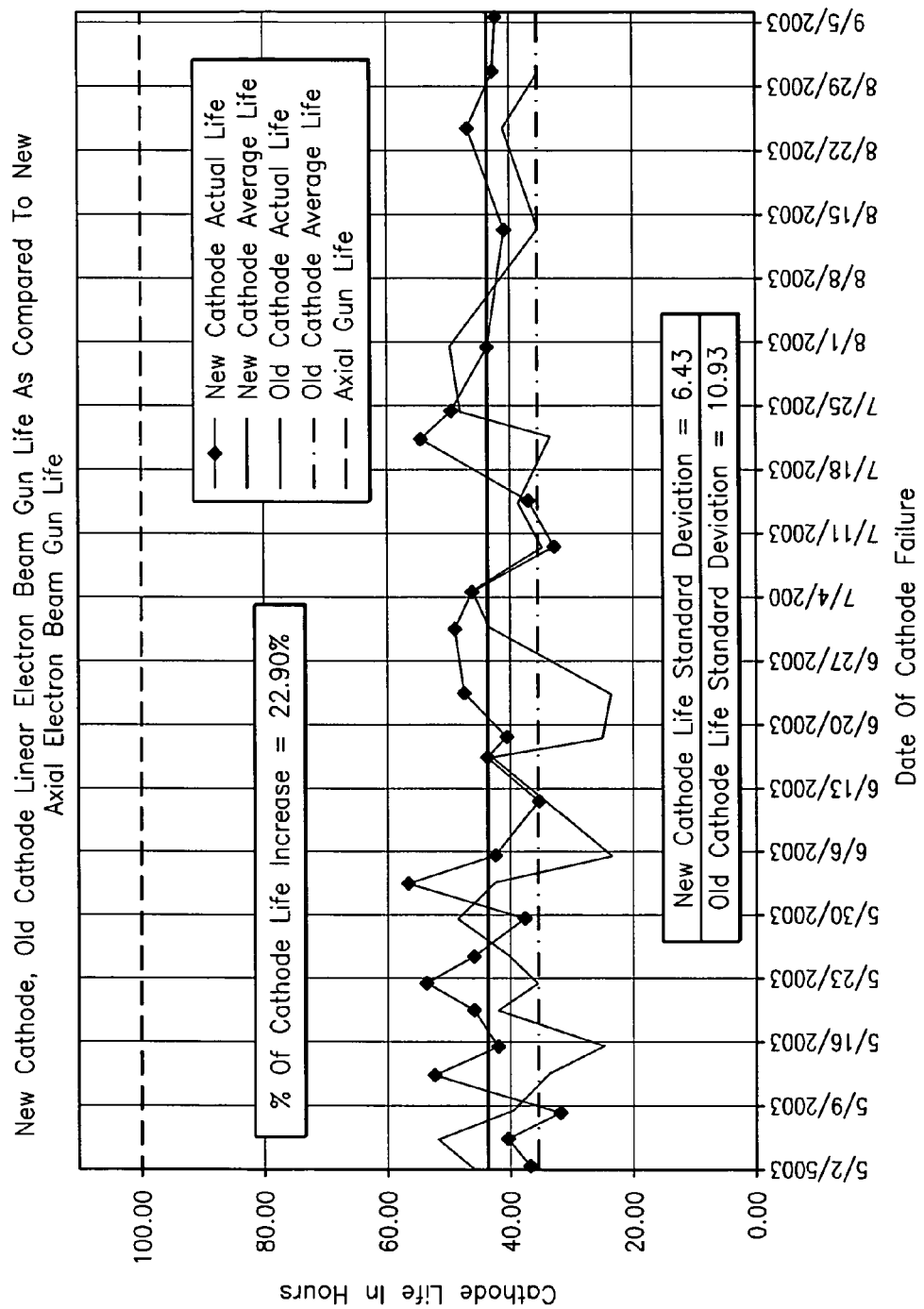
FIG. 3 is a graph comparing the thermionic electron source (or cathode life) of the axial electron gun of the present invention to a first generation linear electron beam gun and a second generation linear electron beam gun of the prior art.

The axial electron gun of the present invention has many advantages over existing flat beam electron gun designs currently available. Referring to FIG. 3, a graph illustrates and compares the useful life of a first generation linear electron beam gun (A) to a second generation linear electron beam gun (B) to the axial electron gun of the present invention (C). Second generation linear electron beam guns overcame certain disadvantages of first generation linear electron beam guns to which second generation linear electron beam guns provided an increase of approximately 22.9% over their average life. The actual life of the present axial electron gun provides an increase of approximately 55% percent over the average life of second generation linear electron beam guns which translates into an actual life of approximately 100%. This significant improvement is due to the present axial electron gun utilizing both a primary thermionic electron source and a secondary thermionic electron source.

During operation, electrons reflect off of the intended target and travel backwards through the gun chamber. These reflected electrodes strike surfaces throughout the gun chamber's interior including the thermionic electron source. In contrast to the present axial electron guns, current electron guns only employ one thermionic electron source that is continuously exposed to reflected electrons. As a result, the thermionic electron source deforms due to constant reflected electrode bombardment and eventually erodes away. This causes the electron beam gun to experience a diminished scanning frequency and changes the evaporation rate of the electron beam gun. In the present axial electron gun, the secondary thermionic electron source possesses a large mass (as compared to the primary thermionic electron source) and acts not only as a source of electrons but also as a target for reflected electrons. Continuous exposure to these reflected electrons will eventually deform and erode the secondary thermionic electron source; however, the primary thermionic electron source will continue operating without experiencing erosion. The resultant design incorporating two thermionic electron sources increases the active life (and average life) of the axial electron gun as compared to currently existing electron gun models, as documented in FIG. 3. Moreover, the present axial electron beam gun experiences a stabilized evaporation rate and an increased scanning frequency. For practical purposes, this increase in its active life translates into the present axial electron gun's ability to effectively double the amount of targets able to be coated during its use.

Secondly, the necessity to replace an electron gun in an existing electron beam coating apparatus spurred the concept behind the present axial electron gun. The inventors of record sought to replace an old model electron beam gun only to discover the newer model electron beam gun was massive in size and measured at least three feet long. Unfortunately, the newer model's size prevented its use in the existing apparatus. As a result, the present axial electron beam gun has a compact design and preferably measures approximately 240 millimeters (9.45 inches) in height and 200 millimeters (7.87 inches) in diameter. It is also contemplated that the dimensions can be altered while maintaining the novel design features. For example, the present axial electron beam gun height may be from approximately 200 millimeters (7.87 inches) to 400 millimeters (15.75 inches) and the diameter may be from approximately 150 millimeters (5.91 inches) to 300 millimeters (11.8 inches). The compact design of the present axial electron gun makes the overall footprint of the entire gun assembly smaller than most electron beam guns currently available yet provides power equivalent to larger assemblies while also possessing a much longer useful life. The compact design also permits the present axial electron beam gun to be fitted to many, if not all, commercially available electron beam coating apparatus. As illustrated in FIG. 1, the axial electron gun may be mounted to an existing structure using any number of methods, for example, screwed, bolted, riveted, punched, clamped and the like.

Thirdly, the present axial electron beam gun also provides significant cost benefits over other commercially available electron guns. It is estimated that the present axial electron beam gun may cost approximately $60,000.00 to $100,000.00 for the entire apparatus. In contrast, existing commercially available electron guns cost approximately $400,000.00 to $500,000.00. And, these existing commercially available electron guns do not possess the design advantages and average useful life demonstrated by the present axial electron gun. Moreover, as experienced by the inventors of record, certain commercially available electron guns cannot be utilized broadly for existing commercially available electron beam coating apparatus to the significant difference in size.

Lastly, the present axial electron beam gun may also be assembled by a single person using common tools. None of the parts are too heavy for one person to lift and piece together. And, in addition, most parts either fit within each other or are secured to one another using screws, bolts and other means for adjusting as described herein. Consequently, an operator may quickly assemble the present axial electron gun using a variety of wrenches and screwdrivers to connect the parts.

It is to be understood that the invention is not limited to the illustrations described and shown herein, which are deemed to be merely illustrative of the best modes of carrying out the invention, and which are susceptible to modification of form, size, arrangement of parts, and details of operation. The invention rather is intended to encompass all such modifications which are within its spirit and scope as defined by the claims.

What is claimed is:

1. An electron gun, comprising:
   a primary thermionic electron source (44), a secondary thermionic electron source (58) and a focusing electrode (62) disposed within a first housing (12) comprising a first platform (15);
   an accelerating anode (78) and one or more focusing coils (86A, 86B) disposed within a second housing (14), said second housing adjustably connected to said first platform by one or more insulating members (11); and
   one or more deflection coils (104A), (104B) disposed within a third housing (16), said third housing connected to said second housing and said third housing being located opposite said first housing,
   wherein said first housing comprises a thermionic electron source assembly comprising:
      a false trap holder (20) comprising a body having a circumferentially disposed lip and an aperture capable of receiving a false trap (18);
      an insulator (26) comprising two halves connected together to form an aperture receiving said false trap holder, said insulator (26) disposed about a filament holder (32), wherein said false trap holder is secured within said insulator by first means for adjusting (28) through one or more first channels (30) and said filament holder is secured to said insulator (26) by second means for adjusting (34) through one or more second channels (36);
      a clamp (40) disposed about said filament holder (32) to form a first cavity receiving said primary thermionic electron source, wherein said filament holder is secured to said clamp by third means (36) for adjusting through one or more third channels (48);
      a first thermal shield (54) comprising a plurality of shield plates, said shield plates having apertures, said primary thermionic electron source (44) being inserted through the apertures of the shield plates therethrough; and
      a second thermal shield (56) having an aperture and disposed below said first thermal shield, said primary thermionic electron source being inserted through the aperture of the second thermal shield; and
   wherein said false trap holder, said insulator and said filament holder combine to form a gun chamber.

2. The electron gun of claim 1, wherein said secondary thermionic electron source is disposed within one or more adjustable rings (60).

3. The electron gun of claim 2, wherein said one or more adjustable rings comprise a pair of adjustable tungsten rings securing said secondary thermionic electron source in place.

4. The electron gun of claim 2, wherein said secondary thermionic electron source (58) disposed within said adjustable rings (60) are disposed within an aperture (70) of said focusing electrode (62) and secured in place between said focusing electrode and a plate (68).

5. The electron gun of claim 4, wherein said secondary thermionic electron source (58) comprises a substantially cylindrical shape having a circumferentially disposed lip (64) about a planar surface.

6. The electron gun of claim 5, wherein said lip (64) of said secondary thermionic electron source (58) is supported by a ledge (66) of said focusing electrode and suspended within said aperture (70).

7. The electron gun of claim 1, wherein said primary thermionic electron source is a filament coil circumferentially disposed between a filament holder (32) and a clamp (40).

8. The electron gun of claim 1, further comprising one or more electrical terminals (52) connected to said second means for adjusting.

9. The electron gun of claim 8, wherein said plates of said first thermal shield (54) are disposed between said second means for adjusting (34) and said insulator (26).

10. The electron gun of claim 1, wherein at least a portion of each of said filament holder, said clamp, said first thermal shield (54) and said second thermal shield are disposed within a thermal barrier enclosure (38) of said first housing.

11. The electron gun of claim 1, wherein said primary thermionic electron source and said secondary thermionic electron source are disposed opposite each other.

12. The electron gun of claim 1, wherein said second housing comprises an electron beam focusing assembly comprising:
said accelerating anode (78) disposed within an anode module and secured by a cover plate;
said focusing coils (86A, 86B) disposed within said anode module; and
a first cooling channel (88) disposed about said focusing coils within said anode module.

13. The electron gun of claim of claim 12, wherein said third housing comprises an electron beam control module comprising:
said deflection coils (104A, 104B) disposed within said control module;
a second cooling channel (100) disposed about said deflection coils within said control module;
wherein said control module is secured to said second housing.

14. The electron gun of claim 1, wherein the electron gun comprises a height of about 200 millimeters (7.87 inches) to 400 millimeters (15.75 inches) and a diameter of about 150 millimeters (5.91 inches) to 300 millimeters (11.8 inches).

15. A method for using the electron gun of claim 1, the method comprising:
heating said primary thermionic electron source;
emitting a first electron beam from said primary thermionic electron source through a first electric field;
striking said secondary thermionic electron source with said first electron beam;
heating said secondary thermionic electron source;
emitting a second electron beam from said secondary thermionic electron source;
accelerating said second electron beam through a second electric field;
focusing said second electron beam through said focusing electrode;
passing said second electron beam through said accelerating anode;
focusing said second electron beam through one or more magnetic fields;
deflecting said second electron beam through one or more magnetic fields; and
striking a target with said second electron beam.

16. The method of claim 15, wherein heating said primary thermionic electron source comprises applying a current of about 1 ampere to 80 amperes to said primary thermionic electron source.

17. The method of claim 15, wherein emitting said first electron beam comprises:
generating a cloud of electrons within said first electric field having a first potential;
focusing said cloud of electrons into said first electron beam; and
directing said first electron beam towards said second thermionic electron source.

18. The method of claim 15, wherein said first electric field and said second electric field comprise opposite potentials.

19. The method of claim 15, wherein said second electron beam comprises a bombardment potential of about 0.5 kilovolts to 2.5 kilovolts.

20. The method of claim 15, wherein said second electric field comprises an accelerating voltage of about 17 kilovolts to 25 kilovolts.

21. The method of claim 15, wherein focusing said second electron beam through said one or more magnetic fields comprises:
generating a first magnetic field by said one or more focusing coils comprising a magnet and a focusing coil; and
passing said second electron beam through said first magnetic field.

22. The method of claim 21, further comprising generating said first magnetic field by applying a current of about 1 ampere to said one or more focusing coils.

23. The method of claim 22, wherein deflecting said second electron beam through said one or more magnetic fields comprises:
generating a second magnetic field by said one or more deflection coils comprising a magnet and a deflection coil; and
passing said second electron beam through said second magnetic field.

24. The method of claim 22, further comprising generating said second magnetic field by applying a current of about 3 amperes to said one or more deflection coils.

25. The method of claim 15, wherein deflecting comprises deflecting said second electron beam at an angle of about 5 degrees to 35 degrees.

26. The method of claim 15, wherein deflecting comprises deflecting said second electron beam at an angle of about 20 degrees.

27. The method of claim 15, further comprising scanning said target with said second electron beam.

28. The method of claim 15, further comprising coating said target with said second electron beam.

* * * * *